United States Patent
Dimitrakopoulos et al.

[11] Patent Number: 5,946,551
[45] Date of Patent: Aug. 31, 1999

[54] FABRICATION OF THIN FILM EFFECT TRANSISTOR COMPRISING AN ORGANIC SEMICONDUCTOR AND CHEMICAL SOLUTION DEPOSITED METAL OXIDE GATE DIELECTRIC

[76] Inventors: Christos Dimitrios Dimitrakopoulos, 791 Lake St., West Harrison; Peter Richard Duncombe, 401 Ringgold St., Peekskill; Bruce K. Furman, 66 Greenwood Dr, Beacon; Robert B. Laibowitz, 407 Furnace Dock Rd., Peekskill, all of N.Y. 10566; Deborah Ann Neumayer, 3 Oak Lane, Danbury, Conn. 06811; Sampath Purushothaman, 2075 Lavoie Ct., Yorktown Heights, N.Y. 10598

[21] Appl. No.: 08/827,015

[22] Filed: Mar. 25, 1997

[51] Int. Cl.$^6$ .................................................. H01L 51/40
[52] U.S. Cl. ........................... 438/99; 438/149; 438/158; 438/216; 438/240; 438/287; 438/785
[58] Field of Search ..................................... 438/149, 216, 438/287, 99, 158, 240, 785

[56] References Cited

U.S. PATENT DOCUMENTS 5,144,473  9/1992  Gemma et al. .......................... 359/270
5,347,144  9/1994  Garnier et al. ............................. 257/40

OTHER PUBLICATIONS

Dimitrakopoulos et al., "Molecular Beam Deposited Thin Films of Pentacene for Organic Field Effect Transistor Applications", J. Appl. Phys. 80(4), Aug. 1996, pp. 2501–2508.
Balk, "Dielectrics for Field Effect Technology", Adv. Mater. 1995, 7, No. 8, pp. 703–710.
Brown et al., "Precursor Route Pentacene Metal–Insulator–Semiconductor Field Effect Transistors", J. Appl. Phys. 79(4), Feb. 1996, pp. 2136–2138.
"A Field–Effect Transistor Based on Conjugated Alpha–Sexithienyl", G. Horowitz et al., Solid State Comm., vol. 72, No. 4, 1989, pp. 381–384.
"All–Polymer Field–Effect Transistor Realized by Printing Techniques", F. Garnier et al., Science, vol. 265, Sep. 1994, pp. 1684–1686.
"All–organic field–effect transistors made of π–conjugated oligomers and polymeric insulators", G. Horowitz et al., Synthetic Metals, 54 (1993) pp. 435–445.

*Primary Examiner*—John F. Niebling
*Assistant Examiner*—David A. Zarneke
*Attorney, Agent, or Firm*—Thomas A. Beck

[57] ABSTRACT

A thin film transistor (TFT) device structure based on an organic semiconductor material, that exhibits a high field effect mobility, high current modulation and a low sub-threshold slope at lower operating voltages than the current state of the art organic TFT devices. A fabrication process for the same, especially a process for deposition of the gate insulator using chemical solutions. The structure comprises a suitable substrate disposed with the following sequence of features: a set of conducting gate electrodes covered with a high dielectric constant insulator, a layer of the organic semiconductor, sets of electrically conducting source and drain electrodes corresponding to each of the gate lines, and an optional passivation layer that can overcoat and protect the device structure.

Use of high dielectric constant gate insulators exploits the unexpected gate voltage dependence of the organic semiconductor to achieve high field effect mobility levels at very low operating voltages. Judicious combinations of the choice of this insulator material and the means to integrate it into the TFT structure are taught that would enable easy fabrication on glass or plastic substrates and the use of such devices in flat panel display applications.

31 Claims, 4 Drawing Sheets

FABRICATION OF THIN FILM EFFECT TRANSISTOR COMPRISING AN ORGANIC SEMICONDUCTOR AND CHEMICAL SOLUTION DEPOSITED METAL OXIDE GATE DIELECTRIC

FIELD OF THE INVENTION

This invention pertains to the field of organic thin film field effect transistors (TFT) that comprise a chemical solution processed gate dielectric of the barium strontium titanate class. In particular it pertains to the field of flat panel liquid crystal displays using such transistors.

BACKGROUND AND PRIOR ART

Thin film field effect transistors (TFT) used in liquid crystal display (LCD) applications typically use amorphous silicon (a-Si:H) as the semiconductor and silicon oxide and/or silicon nitride as the gate insulator. Recent developments in materials have led to the exploration of organic oligomers such as hexathiophene and its derivatives, and organic molecules such as pentacene (G. Horowitz, D. Fichou, X. Peng, Z. Xu, F. Garnier, Solid State Commun. Volume 72, pg. 381, 1989; F. Garnier, G. Horowitz, D. Fichou, U.S. Pat. No. 5,347,144) as potential replacements for amorphous silicon as the semiconductor in thin-film field-effect transistors.

Recently, organic TFT comprising relatively high dielectric constant gate dielectrics were described (C. D. Dimitrakopoulos, B. K. Furman, S. Purushothaman, D. A. Neumayer, R. B. Laibowitz, P. R. Duncombe, (Docket No. YO997-057) filed on the same day herewith and incorporated herein by reference) which have the advantage of relatively low voltage operation and performance comparable to that of amorphous silicon TFT.

The fabrication of metal oxide films by chemical solution processing has been described recently, especially the case in which metal alkoxyalkoxide solutions are employed (D. A. Neumayer, P. R. Duncombe (Docket No. YO997-069) filed on Mar. 10, 1997 and incorporated herein by reference).

The electrical characteristics of TFT's having pentacene as the semiconductor, a heavily doped Si-wafer as the gate electrode, thermally grown $SiO_2$ on the surface of the Si-wafer as the gate insulator, and Au source and drain electrodes, are adequately modeled by standard field effect transistor equations (S. M. Sze "Physics of Semiconductor Devices", Wiley, New York, 1981, pg. 442), as shown previously (G. Horowitz, D. Fichou, X. Peng, Z. Xu, F. Garnier, Solid State Commun. Volume 72, pg. 381, 1989; C. D. Dimitrakopoulos, A. R. Brown, A. Pomp, J. Appl. Phys. Volume 80, pg. 2501, 1996). The pentacene used in these devices behaves as a p-type semiconductor. When the gate electrode is biased negatively with respect to the grounded source electrode, pentacene-based TFT's operate in the accumulation mode and the accumulated carriers are holes. At low $V_D$, $I_D$ increases linearly with $V_D$ (linear region) and is approximately given by the equation:

$$I_D = \frac{WC_i}{L}\mu\left(V_G - V_T - \frac{V_D}{2}\right)V_D \quad (1)$$

where L is the channel length, W is the channel width, $C_i$ is the capacitance per unit area of the insulating layer, and $V_T$ is a threshold voltage. The field effect mobility, $\mu$ can be calculated in the linear region from the transconductance:

$$g_m = \left(\frac{\partial I_D}{\partial V_G}\right)_{V_D=const} = \frac{WC_i}{L}\mu V_D, \quad (2)$$

by plotting $I_D$ vs. $V_G$ at a constant low $V_D$ and equating the value of the slope of this plot to $g_m$.

When the drain electrode is more negatively biased than the gate electrode (i.e. $-V_D \geq -V_G$), with the source electrode being grounded (i.e. $V_S=0$), the current flowing between source and drain electrodes ($I_D$) tends to saturate (does not increase any further) due to the pinch-off in the accumulation layer (saturation region), and is modeled by the equation:

$$I_D = \frac{WC_i}{2L}\mu(V_G - V_T)^2. \quad (3)$$

The field effect mobility can be calculated from the slope of the $\sqrt{|I_D|}$ vs. $V_G$ plot.

OBJECT OF THE INVENTION

It is an object of this invention is to demonstrate the fabrication process of TFT structures that contain an inorganic high dielectric constant gate insulator layer (for example, barium strontium titanate) in combination with an organic semiconductor (for example, pentacene).

It is another object of this invention to produce organic TFT structures wherein the high dielectric constant gate insulator is deposited by chemical solution processing and is subsequently processed at temperatures compatible with glass and plastic substrates (150 to 400° C.), which are substantially lower than the processing temperatures of these materials when they are used for memory applications (up to 650° C.).

In particular, it is another object of this invention to produce organic TFT structures wherein the high dielectric constant gate insulator comprises a metal oxide thin film, preferably barium strontium titanate, barium titanate, bismuth titanate, strontium titanate, barium zirconate titanate, strontium bismuth tantalate niobate and strontium bismuth tantalate which is deposited by chemical solution processing, employing metal alkoxyalkoxide solutions, preferably metal butoxyethoxides.

SUMMARY OF THE INVENTION

The proposed TFT structures and fabrication processes make use of a high dielectric constant thin film gate insulator such as barium strontium titanate (BST), an organic semiconductor such as pentacene, and a metal, conducting polymer, highly doped high conductivity material or a combination thereof as the gate, source, and drain electrodes.

There are many candidate materials with high dielectric constant that can be used as gate insulator layers in the above structures, including but not restricted to $Ta_2O_5$, $Y_2O_3$, $TiO_2$, and the family of ferroelectric insulators, including but not restricted to $PbZr_xTi_{1-x}O_3$ (PZT), $Bi_4Ti_3O_{12}$, $BaMgF_4$, $SrBi_2(Ta_{1-x}Nb_x)_2O_9$, $Ba(Zr_{1-x}Ti_x)O_3$ (BZT), $Ba_xSr_{1-x}TiO_3$ (BST), $BaTiO_3$, $SrTiO_3$, and $Bi_4Ti_3O_{12}$. Typically these insulators are annealed at 600° C. or higher to achieve dielectric constant ($\epsilon$) values exceeding 150.

In general the proposed structure uses an inorganic, high dielectric constant gate insulator in combination with an organic semiconductor (e.g. pentacene) in a TFT structure.

The high ε insulator is annealed at 400° C. to achieve an ε≧15, which makes possible the use of glass or plastic substrates.

A typical sequence used in the fabrication of the proposed TFT structures includes the following steps:

- preparation of the gate electrode, which can be either the substrate itself, in such case being heavily doped Si, or a patterned metal (or conducting polymer or other conductive material) gate electrode deposited and patterned on a substrate;
- deposition of the high dielectric constant gate insulator on top of the gate electrode by sol gel spin coating;
- optionally annealing the films at a suitable temperature in the range of 150 to 400° C. to improve the film quality and enhance the dielectric constant;
- deposition of the organic semiconductor on top of the gate insulator by one of various processes including but not restricted to vapor deposition, spin-coating from solution or self assembly of layers from solution;
- fabrication of the electrically conducting source and drain electrodes on top of the organic semiconductor;
- and optionally applying a passivation coating of an insulator by chemical vapor deposition (CVD), physical vapor deposition or spin coating and curing.

The sequence of the steps comprising the deposition of the organic semiconductor and the fabrication of the source and drain electrodes could be reversed to allow process compatibility and ease of fabrication.

DETAILED DESCRIPTION OF THE PREFERRED EMBODIMENTS

Figure 1:
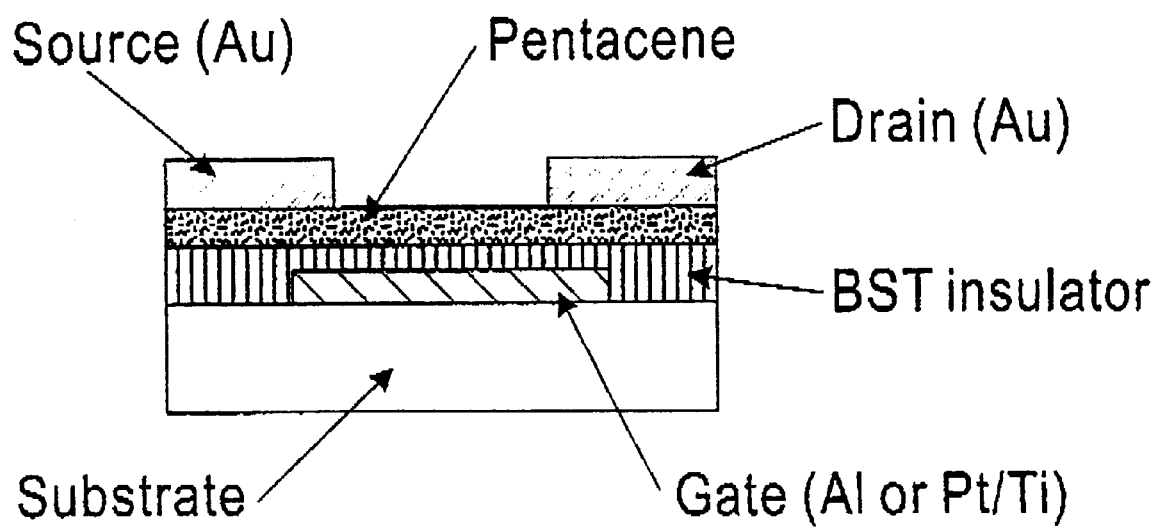
FIG. 1 depicts a schematic sketch of the pentacene-based TFT devices with a high dielectric constant gate insulator proposed in this application.

The present invention broadly contemplates the fabrication of thin-film field effect transistors comprising an organic semiconductor and a metal oxide film such as barium strontium titanate, bismuth titanate, strontium bismuth tantalate, barium titanate and strontium titanate as gate insulator. These gate insulators were fabricated using metal alkoxyalkoxides in solution. The metal alkoxyalkoxide solution is formed from dissolving metal alkoxyalkoxides in a solvent. The metal alkoxyalkoxide solution is applied to a substrate and heated to form the metal oxide film.

A metal alkoxyalkoxide is a compound of the form $ML_a$, where M is a metal, L is an alkoxyalkoxide ligand, and α is subscript indicating the number of units of the alkoxyalkoxide ligand required to agree with the valence requirements. An alkoxyalcohol is distinguished from an alcohol by the existence of an ether linkage, C-O-C in the hydrocarbon backbone of the alkoxyalcohol. Metals that may be used include barium, strontium, titanium, bismuth, tantalum, magnesium, lead, yttrium, lanthanum, magnesium, calcium, zirconium, niobium and other elements. Alkoxyalcohols that may be used include methoxyethanol, ethoxyethanol, propoxyethanol, butoxyethanol, pentoxyethanol, heptoxyethanol, methoxypropanol, ethoxypropanol, propoxypropanol, butoxypropanol, pentoxypropanol, and heptoxypropanol, preferably butoxyethanol. Any of the metals listed above with any of the alkoxyalcohols listed may be used to form a metal alkoxyalkoxide. The metal alkoxyalkoxide solution is synthesized using any miscible solvent. Miscible solvents that may be used include hydrocarbons such as xylenes, toluene, halogenated solvents such as chloroform, and alcohols such as methanol, ethanol, isopropanol, methoxyethanol, ethoxyethanol, propoxyethanol, butoxyethanol, pentoxyethanol, heptoxyethanol, methoxypropanol, ethoxypropanol, propoxypropanol, butoxypropanol, pentoxypropanol, and heptoxypropanol, preferably butoxyethanol.

A metal alkoxyalkoxide is synthesized by reacting the metal with an excess of alkoxyalcohol, or by reacting a metal alkoxide with an excess of alkoxyalcohol or by reacting a metal halide salt with the lithium, sodium or potassium salt of the alkoxyalcohol. If an alkali metal (Group 1A: Li, Na, K, Rb, Cs, Fr) metal or an alkaline earth (Group 2A: Be, Mg, Ca, Sr, Ba, Ra) metal is added to an excess of alkoxyalcohol and heated, the following reaction occurs $$M+L \rightarrow ML_a + \tfrac{1}{2}H_2 \tag{1}$$

If a metal alkoxide is added to an excess of alkoxyalcohol and heated the following reaction occurs where A is an alkoxide.

$$MA_a + L \rightarrow ML_a + aA \tag{2}$$

If a sufficiently reactive metal halide salt is added to an alkali metal (Group 1A: Li, Na, K, Rb, Cs, Fr) salt of the alkoxyalcohol and heated, the following reaction occurs, where X is a halide, and N is alkali metal (Group 1A: Li, Na, K, Rb, Cs, Fr).

$$MX_a + aNL \rightarrow ML_a + aNX \tag{3}$$

The above reaction summary is generalized and the specific reactions that occur depend on the metals, alkoxides and alkoxyalcohols used. Detailed examples will be given below.

Once the metal alkoxyalkoxide is formed it is dissolved into a miscible solvent and applied to a substrate. The coated substrate is thermally treated to densify the film. The coated substrate may be annealed to crystallize the film. Detailed examples will be given below.

Examples of precursors according to the invention and processes according to the invention for utilizing the precursors are given below.

EXAMPLE 1

Preparation of Ba(butoxyethoxide)$_2$

Under nitrogen, 25.2 g barium metal was added to 123 ml of butoxyethanol. The slurry was refluxed for 1 h to complete the reaction. The solution was cooled to room temperature, and filtered through a celite bed in vacuo. The filtrate was the barium butoxyethoxide stock solution with a concentration of 1.42 moles/liter or 22.69 weight percent of barium.

EXAMPLE 2

Preparation of Sr(butoxyethoxide)$_2$

Under nitrogen 26.1 g strontium metal was added to 293 g of butoxyethanol. The slurry was refluxed for 1 h to complete the reaction. The solution was cooled to room temperature, and filtered through a celite bed in vacuo. The filtrate was the strontium butoxyethoxide stock solution with a concentration of 0.919 moles/liter or 8.92 weight percent of strontium.

EXAMPLE 3

Preparation of Ti(butoxyethoxide)$_4$

Under nitrogen, 110 g titanium (IV) isopropoxide was added to 100 ml of butoxyethanol. The isopropanol was distilled away and an additional 100 ml of butoxyethanol was added and refluxed for 1 h. The solution was cooled to room temperature, and filtered through a celite bed in vacuo. The filtrate was the titanium butoxyethoxide stock solution with a final concentration of 1.53 moles/liter or 7.91 weight percent of titanium.

EXAMPLE 4

Fabrication of a $Ba_{0.7}Sr_{0.3}TiO_3$ Film with a Ba, Sr, Ti butoxyethoxide solution Under nitrogen, 11.11 g (0.0175 mole) barium butoxyethoxide stock solution (example 1), 8.57 g (0.0075 mole) strontium butoxyethoxide stock solution (example 2), 15.14 g (0.025 mole) and titanium butoxyethoxide stock solution (example 3) were dissolved in butoxyethanol. The solution was stirred overnight at room temperature, filtered and diluted to 50 ml. The resultant 0.5M stock solution may be stored under nitrogen for several months without degradation. A spin solution affording 400 Å/layer films was prepared by diluting 1 part $Ba_{0.7}Sr_{0.3}Ti$ stock solution with three parts butoxyethanol. The spin solution was loaded into a syringe and a 0.45 lam and 0.2 $\mu$m Whatman syringe filters were attached. The solution was syringed onto Pt/Ti/SiO$_2$/Si substrate until the substrate was completely wetted. The substrate was then spun for 60 sec at 2500 rpm. The coated substrate was dried on a hot plate at 300° C. and then annealed in O$_2$ at 400° C. for 10 min. Additional layers of the same film were deposited to fabricate thicker films. After annealing, Pt dots were evaporated onto the film and the capacitance across the film was measured. The resultant samples had dielectric constants of 16 to 17. When the coated substrate was dried on a hot plate at 300° C. and then annealed by rapid thermal processing at 700° C. for 2 min after deposition of each layer, the resultant three and four layer samples had dielectric constants of 200–340.

EXAMPLE 5

Preparation of Zr(butoxyethoxide)$_4$

Under nitrogen, 110 g zirconium (IV) isopropoxide was added to 100 ml of butoxyethanol. The isopropanol was distilled away and an additional 100 ml of butoxyethanol was added and refluxed for 1 h. The solution was cooled to room temperature, and filtered through a celite bed in vacuo. The filtrate was the zirconium butoxyethoxide stock solution.

EXAMPLE 6

Fabrication of a $Ba(Zr_{0.5}Ti_{0.5})O_3$ Film with a Ba, Zr, Ti butoxyethoxide solution Under nitrogen, 0.025 mole barium butoxyethoxide stock solution (example 1), 0.0125 mole zirconium butoxyethoxide stock solution (example 4) and 0.0125 mole titanium butoxyethoxide stock solution (example 3) were dissolved in butoxyethanol. The solution was stirred overnight at room temperature, filtered and diluted to 50 ml. The resultant 0.5M stock solution may be stored under nitrogen for several months without degradation. A solution for spin coating was prepared by diluting 1 part BaZrTi stock solution with three parts butoxyethanol. The spin solution was loaded into a syringe and a 0.45 $\mu$m and 0.2 $\mu$m Whatman syringe filters were attached. The solution was syringed onto Pt/Ti/SiO$_2$/Si substrate until the substrate was completely wetted. The substrate was then spun for 60 sec at 2500 rpm. The coated substrate was dried on a hot plate at 300 ° C. and then annealed in O$_2$ at 400 ° C. for 10 min. Additional layers were deposited to fabricate thicker films.

EXAMPLE 7

Preparation of Ba(methoxyethoxide)$_2$

Under nitrogen, 25.1 g barium metal was added to 250 ml of methoxyethanol. The slurry was refluxed for 1 h to complete the reaction. The solution was cooled to room temperature, and filtered through a celite bed in vacuo. The filtrate was the barium methoxyethoxide stock solution with a concentration of 0.58 moles/liter or 8.27 weight percent of barium.

EXAMPLE 8

Preparation of Sr(methoxyethoxide)$_2$

Under nitrogen 25.4 g strontium metal was added to 185 g of methoxyethanol. The slurry was refluxed for 1 h to complete the reaction. The solution was cooled to room temperature, and filtered through a celite bed in vacuo. The filtrate was the strontium methoxyethoxide stock solution with a concentration of 1.51 moles/liter or 13.75 weight percent of strontium.

EXAMPLE 9

Preparation of Ti(methoxyethoxide)$_4$

Under nitrogen, 71.06 g titanium (IV) isopropoxide was added to 100 ml of methoxyethanol. The isopropanol was distilled away and an additional 100 ml of methoxyethanol was added and refluxed for 1 h. The solution was cooled to room temperature, and filtered through a celite bed in vacuo. The filtrate was the titanium methoxyethoxide stock solution with a final concentration of 1.09 moles/liter or 5.42 weight percent of titanium.

EXAMPLE 10

Fabrication of a $Ba_{0.7}Sr_{0.3}TiO_3$ Film with a Ba, Sr, Ti methoxyethoxide solution Under nitrogen with stirring, 58.12 g (0.035 mole) barium methoxyethoxide stock solution (example 7), 10.07 g (0.015 mole) strontium methoxyethoxide stock solution (example 8), and 44.19 g (0.050 mole) titanium methoxyethoxide stock solution (example 9) was dissolved together in 2-methoxyethanol. The solution was stirred overnight at room temperature, filtered and diluted to the mark in a 250 ml volumetric flask. The 0.2M stock solution may be stored under nitrogen for several months without degradation. A spin solution affording 200 Å/layer films was prepared by diluting 1 part $Ba_{0.7}Sr_{0.3}Ti$ methoxyethoxide stock solution with one part isopropanol. The spin solution was loaded into a syringe and a 0.45 $\mu$m and 0.2 $\mu$m Whatman syringe filters were attached. The solution was syringed onto a Pt/Ti/SiO$_2$/Si substrate until the substrate was completely wetted. The substrate was then spun for 60 sec at 2500 rpm. The coated substrate was dried on a hot plate at 200–400° C. and then annealed in O$_2$ at 400° C. for min. Additional layers were deposited to fabricate thicker films.

EXAMPLE 11

Preparation of $Ta(butoxyethoxide)_5$

Under nitrogen with stirring, 53.13 g tantalum (V) ethoxide was added to 150 ml of butoxyethanol. The ethanol was distilled away and an additional 50 ml of butoxyethanol was added and refluxed for 1 h. The solution was cooled to room temperature, and filtered through a celite bed in vacuo. The filtrate was the tantalum butoxyethoxide stock solution.

EXAMPLE 12

Preparation of $Ta(methoxyethoxide)_5$

Under nitrogen with stirring, 4.06 g tantalum (V) ethoxide was added to 100 ml of methoxyethanol. The solution was refluxed for 1 h before the ethanol was distilled away. An additional 100 ml of methoxyethanol was added and the sequence was repeated two more times. The solution was cooled to room temperature, and filtered through a celite bed in vacuo. The filtrate was the tantalum methoxyethoxide stock solution with a final concentration of 0.079 moles/liter or 1.5 weight percent of tantalum.

EXAMPLE 13

Preparation of $Zr(methoxyethoxide)_5$

Under nitrogen with stirring, 96.92 g zirconium (IV) isopropoxide was added to 100 ml of methoxyethanol. The solution was refluxed for 1 h before the ethanol was distilled away. An additional 100 ml of methoxyethanol was added and the sequence was repeated two more times. The solution was cooled to room temperature, and filtered through a celite bed in vacuo. The filtrate was the zirconium methoxyethoxide stock solution with a final concentration of 0.94 moles/liter or 8.89 weight percent of zirconium.

EXAMPLE 14

Fabrication of a $Ba(Zr_{0.5}Ti_{0.5})O_3$ Film with a Ba, Zr, Ti methoxyethoxide solution Under nitrogen, 0.02 mole barium methoxyethoxide stock solution (example 1), 0.01 mole zirconium butoxyethoxide stock solution (example 4) and 0.01 mole titanium methoxyethoxide stock solution (example 3) were dissolved in methoxyethanol. The solution was stirred overnight at room temperature, filtered and diluted to 100 ml. The resultant 0.2M stock solution may be stored under nitrogen for several months without degradation. A spin solution was prepared by diluting 1 part BaZrTi stock solution with one part methoxyethanol. The spin solution was loaded into a syringe and a 0.45 $\mu$m and 0.2 $\mu$m Whatman syringe filters were attached. The solution was syringed onto Pt/Ti/SiO$_2$/Si substrate until the substrate was completely wetted. The substrate was then spun for 60 sec at 2500 rpm. The coated substrate was dried on a hot plate at 300° C. and then annealed in O$_2$ at 400° C. for 10 min. Additional layers were deposited to fabricate thicker films.

EXAMPLE 15

Preparation of $Bi(butoxyethoxide)_3$

Under inert atmosphere, 28.9 g (0.244 mole) of butoxyethanol was added drop wise to a stirring suspension of 9.45 g (0.394 mole) sodium hydride in 100 ml of tetrahydrofuran. After stirring for 30 minute, the slurry was filtered through a celite bed. To the filtrate was added 25.0 g (0.0793 mole) of BiCl$_3$ dissolved in 100 ml of tetrahydrofuran. After stirring for 12 h, the tetrahydrofuran was removed in vacuo resulting in cloudy yellow slurry which was extracted with 250 ml of anhydrous toluene. The extract was filtered through a celite bed. The toluene was removed from the filtrate in vacuo resulting in a pale yellow oil which was extracted with 500 ml of pentane. The pentane extract was filtered through a celite bed and the pentane removed from the filtrate in vacuo resulting in a pale yellow liquid.

EXAMPLE 16

Preparation of $Nb(butoxyethoxide)_5$

Under nitrogen with stirring, 50.22 g niobium (V) ethoxide was added to 150 ml of butoxyethanol. The ethanol was distilled away and an additional 50 ml of butoxyethanol was added and refluxed for 1 h. The solution was cooled to room temperature, and filtered through a celite bed in vacuo. The filtrate was the niobium butoxyethoxide stock solution.

EXAMPLE 17

Fabrication of a $SrBi_2Ta_2O_9$ Film with a Sr, Bi, Ta butoxyethoxide solution

Under nitrogen, add 0.02 mole of a strontium butoxyethoxide stock solution (example 2), 0.04 mole bismuth butoxyethoxide stock solution (example 15), 0.04 mole of a tantalum butoxyethoxide stock solution (example 11). Stir overnight at room temperature, filter and dilute to 100 ml. A spin solution was prepared by diluting 1 part SrBi$_2$Ta$_2$ stock solution with one part butoxyethanol. The spin solution was loaded into a syringe and a 0.45 $\mu$m and 0.2 $\mu$m Whatman syringe filters were attached. The solution was syringed onto Pt/Ti/SiO$_2$/Si substrate until the substrate was completely wetted. The substrate was then spun for 60 sec at 2500 rpm. The coated substrate was dried on a hot plate at 300° C. and then annealed at either 400° C. or 750° C. for 30 min. Additional layers were deposited to fabricate thicker films.

EXAMPLE 18

Fabrication of a $Sr_{0.8}Bi_{2.2}Ta_2O_9$ Film with a Sr, Bi, Ta butoxyethoxide solution Under nitrogen, add 0.016 mole of a strontium butoxyethoxide stock solution (example 2), 0.044 mole bismuth butoxyethoxide stock solution (example 15), 0.04 mole of a tantalum butoxyethoxide stock solution (example 11). Stir overnight at room temperature, filter and dilute to 100 ml. A spin solution was prepared by diluting 1 part $Sr_{0.8}Bi_{2.2}Ta_2$ stock solution with one part butoxyethanol. The spin solution was loaded into a syringe and a 0.45 µm and 0.2 µm Whatman syringe filters were attached. The solution was syringed onto Pt/Ti/SiO$_2$/Si substrate until the substrate was completely wetted. The substrate was then spun for 60 sec at 2500 rpm. The coated substrate was dried on a hot plate at 300° C. and then annealed at either 400° C. or 750° C. for 30 min. Additional layers were deposited to fabricate thicker films.

EXAMPLE 19

Fabrication of a $SrBi_2(Ta_{1.5}Nb_{0.5})O_9$ Film with a Sr, Bi, Ta, Nb butoxyethoxide solution Under nitrogen, add 0.02 mole of a strontium butoxyethoxide stock solution (example 2), 0.04 mole bismuth butoxyethoxide stock solution (example 15), 0.03 mole of a tantalum butoxyethoxide stock solution (example 11) and 0.01 mole of a niobium butoxyethoxide solution (example 16). Stir overnight at room temperature, filter and dilute to 100 ml. A spin solution was prepared by diluting 1 part $Sr_{0.8}Bi_{2.2}Ta_2$ stock solution with one part butoxyethanol. The spin solution was loaded into a syringe and a 0.45 µm and 0.2 µm Whatman syringe filters were attached. The solution was syringed onto Pt/Ti/SiO$_2$/Si substrate until the substrate was completely wetted. The substrate was then spun for 60 sec at 2500 rpm. The coated substrate was dried on a hot plate at 300° C. and then annealed at either 400° C. or 750° C. for 30 min. Additional layers were deposited to fabricate thicker films.

EXAMPLE 20

Fabrication of a $Bi_4Ti_3O_{12}$ Film with a Bi, Ti butoxyethoxide solution

Under nitrogen, 0.02 mole of a bismuth butoxyethoxide stock solution (example 15) and 0.015 mole of a titanium butoxyethoxide stock solution (example 3) was mixed together and stirred overnight at room temperature. The solution was filtered and diluted to 100 ml with butoxyethanol. Stir overnight at room temperature, filter and diluted to 100 ml. A spin solution was prepared by diluting 1 part $Bi_4Ti_3$ stock solution with one part butoxyethanol. The spin solution was loaded into a syringe and a 0.45 µm and 0.2 µm Whatman syringe filters were attached. The solution was syringed onto Pt/Ti/SiO$_2$/Si substrate until the substrate was completely wetted. The substrate was then spun for 60 sec at 2500 rpm. The coated substrate was dried on a hot plate at 300° C. and then annealed at either 400° C. or 700° C. for 10 min. Additional layers were deposited to fabricate thicker films.

EXAMPLE 21

Fabrication of a $Ba_{0.7}Sr_{0.3}TiO_3$ Film with a Ba, Sr, Ti isopropanol/acetic acid solution In a glove box, 23.985 g (0.035 mole) of 20.04 weight % BaIPA$_2$ in IPA, 13.893 g (0.015 mole) of 9.46 weight % SrIPA$_2$ in IPA and 14.213 g (0.05 mole) of TIP were mixed together. Under nitrogen with stirring an additional 200 ml of anhydrous IPA and 50 ml of glacial acetic acid were added. A white precipitate forms which redissolves with stirring. The solution was stirred overnight at room temperature before vacuum filtration through a celite bed. Stored under nitrogen, the stock solution was stable for approximately one month before precipitation of barium species was observed. The spin solution was prepared by diluting the stock solution 1:1 with an equal volume of IPA. The spin solution was loaded into a syringe and a 0.45 µm and 0.2 µm Whatman syringe filters were attached. The solution was syringed onto a Pt/Ti/SiO$_2$/Si substrate until the substrate was completely wetted. The substrate was then spun for 60 sec at 2500 rpm. The coated substrate was dried on a hot plate at 350° C. and then annealed at 400° C. for 10 min. Additional layers were deposited to fabricate thicker films. Pt dots were evaporated on top of the annealed film and the capacitance measured across the film.

EXAMPLE 22

Fabrication of Organic Thin Film Transistors with Chemical Solution Deposited Gate Dielectrics We have fabricated TFT's having as gate insulator a thin film of barium strontium titanate, which was deposited using chemical solution deposition. The organic semiconductor used in these devices was pentacene deposited by vacuum sublimation. The gate electrode was aluminum or a Pt/Ti bilayer while the source and drain electrodes consisted of Au. The substrates used were either quartz disks or Si wafers covered with a thermally grown SiO$_2$ layer. Oxidized silicon or quartz substrates were cleaned in an isopropanol bath using ultrasonic agitation and dried with nitrogen. They were then assembled with a metal mask with openings corresponding to the gate lines and placed and pumped down to high vacuum in an electron beam evaporator. Gate metallization of either 40 nm of aluminum or a bilayer of 15 nm titanium followed by 30 nm of Pt was deposited on the substrates by electron beam evaporation. The samples were unloaded from the assembly and coated with a layer of high dielectric constant insulator by the chemical solution processes described in the previous examples. In this process metal oxide films are fabricated using a precursor comprising either a short chain metal alkoxide exemplified by but not restricted to metal isopropoxide, or a metal alkoxyalkoxide solution. The organic semiconductor layer (pentacene) was deposited using vapor deposition in an ultra high vacuum (UHV) chamber. We have also used deposition in lower cost high vacuum chambers and comparable results are also obtained in this case. Alternatively, this film could be deposited using a soluble precursor of pentacene which is converted to pentacene by heating up to 140° C. in vacuo (A. R. Brown, A. Pomp, D. M. de Leeuw, D. B. M. Klaassen, E. E. Havinga, P. Herwig, K. Müllen *Journal of Applied Physics*, Volume 79, pg. 2136, 1996). The samples are then assembled with a mask provided with openings for source and drain contact electrodes, placed and pumped down in an electron beam evaporator and coated with 60 nm of gold to produce the source/drain contacts. The resulting TFT structure is shown schematically in FIG. 1. Other source drain contact materials such as chromium, titanium, copper, aluminum, molybdenum, tungsten, nickel, gold, platinum, palladium, conducting polymers, oligomers and organic molecules, can be used without deviating from the spirit of the invention.

Completed TFT samples were then tested electrically using a Hewlett Packard Model 4145B semiconductor parameter analyzer to determine their operating characteristics.

Figure 2A:
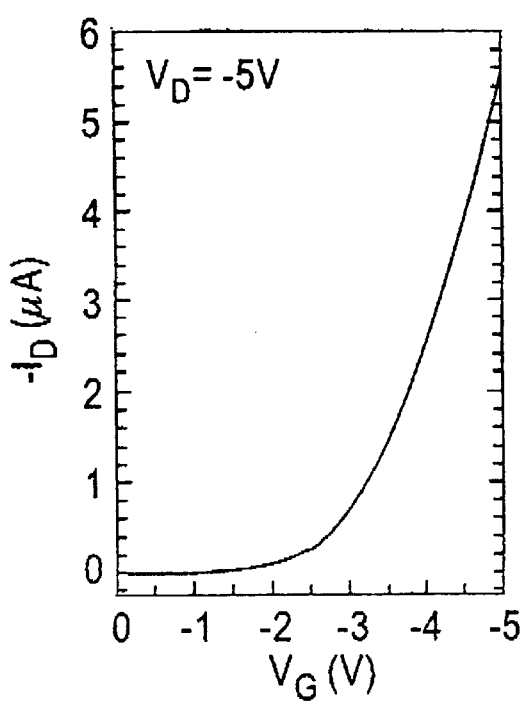
FIG. 2a is the measured operating characteristics of a TFT device using as-received (97+% pure) pentacene as semiconductor and a 90 nm thick layer of barium strontium titanate film (deposited by spin coating of a Ba, Sr, Ti isopropanol/acetic acid solution, as described in Example 21) as the gate insulator. Dependence of the drain current on the gate voltage at a fixed source-drain voltage is shown.
Figure 2B:
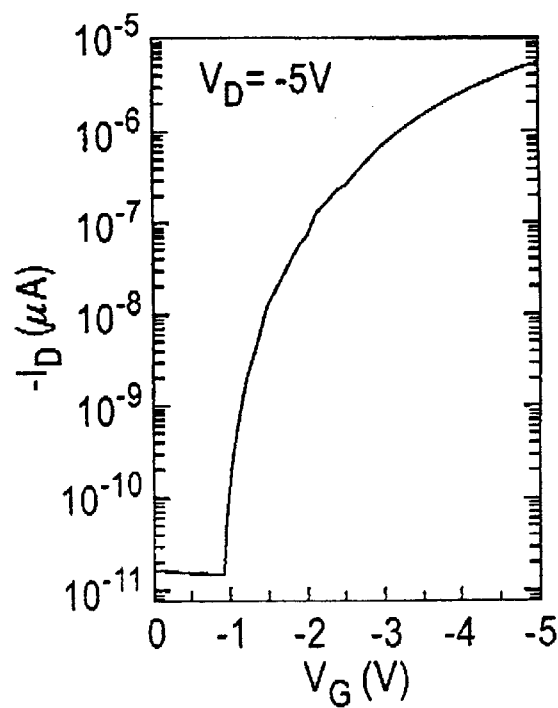
FIG. 2b is the plot of the data from FIG. 2a in a semilogarithmic scale used to calculate the current modulation and sub-threshold slope.
Figure 2C:
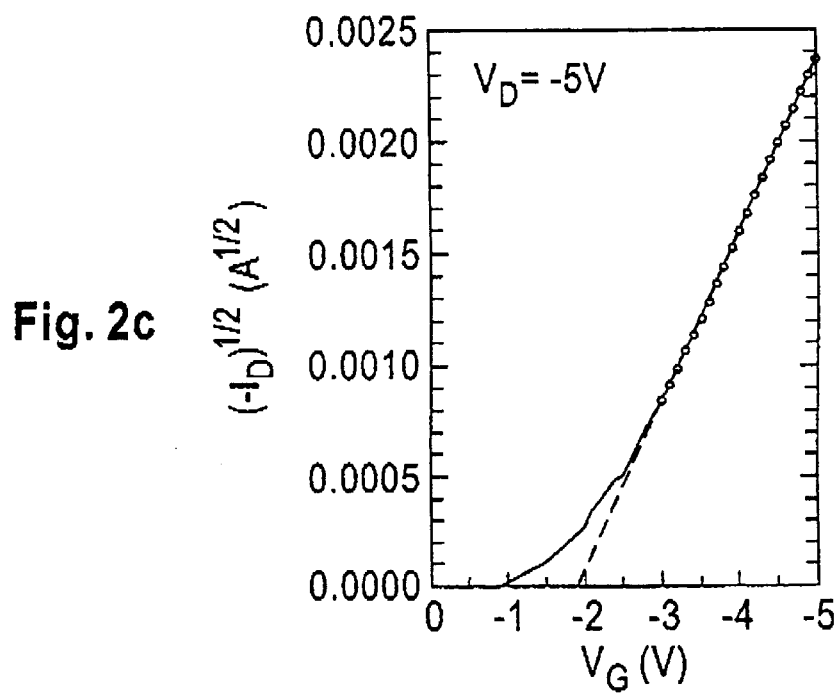
FIG. 2c is a plot of the square root of the drain current from FIG. 2a as a function of the gate voltage in the saturation regime to calculate the field effect mobility.

FIGS. 2a and 2b are typical operating characteristics of a pentacene-based TFT, represented by the schematic drawing in FIG. 1, in which the thickness of the BST gate-insulator was approximately 90 nm and its dielectric constant, $\epsilon \cong 16$. The insulator was deposited from an isopropoxide based solution in isopropanol as described earlier. The source drain separation (channel length, L) was 83 $\mu$m and the channel width, W, was 1500 $\mu$m. Both figures show the dependence of $I_D$ on $V_G$ in saturation. FIG. 2c shows a plot of the square root of $I_D$ vs $V_G$. The field effect mobility, $\mu$, is calculated from the slope of the $\sqrt{|I_D|}$ vs. $V_G$ plot to be 0.38 cm$^2$ V$^{-1}$ sec$^{-1}$. The current modulation is more than 3×10$^5$ for a gate voltage variation of 4 volts. The sub-threshold slope, S, is approximately 0.4 volts per decade of current modulation.

Figure 3:
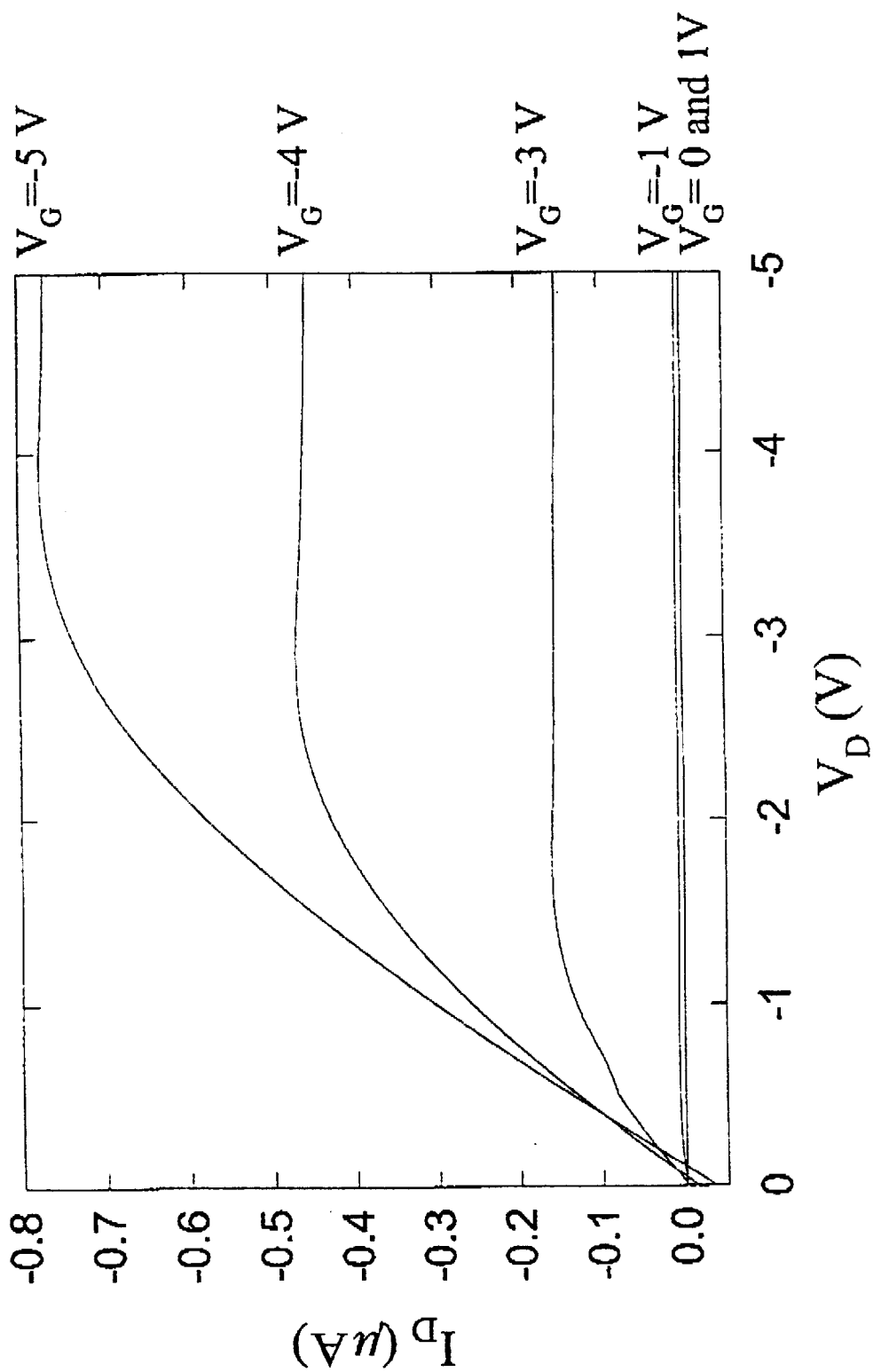
FIG. 3 is the measured operating characteristics of a TFT device using as-received (97+% pure) pentacene as semiconductor and a barium strontium titanate film (deposited by spin coating of a Ba, Sr, Ti isopropanol/acetic acid solution, as described in Example 21) as the gate insulator. Dependence of the drain current on the source-drain voltage is shown at different gate voltage levels.

FIG. 3 shows the dependence of the current flowing between source and drain electrodes ($I_D$) on the voltage applied to the drain electrode ($V_D$), at discrete voltages applied to the gate electrode ($V_G$) for the device described in the previous paragraph.

Figure 4A:
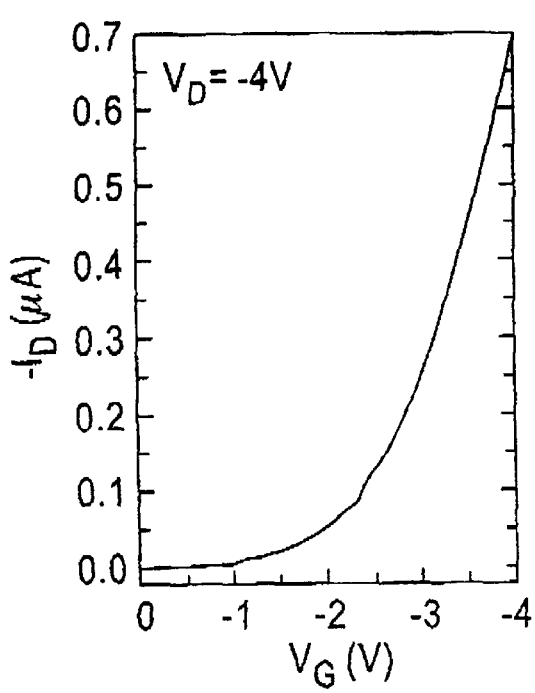
FIG. 4a is the measured operating characteristics of a TFT device using as-received (97+% pure) pentacene as semiconductor and an approximately 90 nm thick layer of barium strontium titanate film (deposited by spin coating of a Ba, Sr, Ti butoxyethoxide solution in butoxyethanol, as described in Example 4) as the gate insulator. Dependence of the drain current on the gate voltage at a fixed source-drain voltage is shown.
Figure 4B:
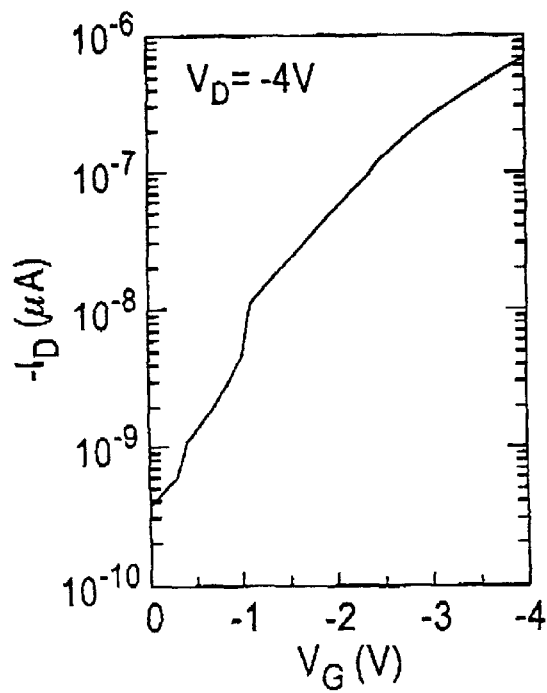
FIG. 4b is the plot of the data from FIG. 4a in a semilogarithmic scale used to calculate the current modulation and sub-threshold slope.
Figure 4C:
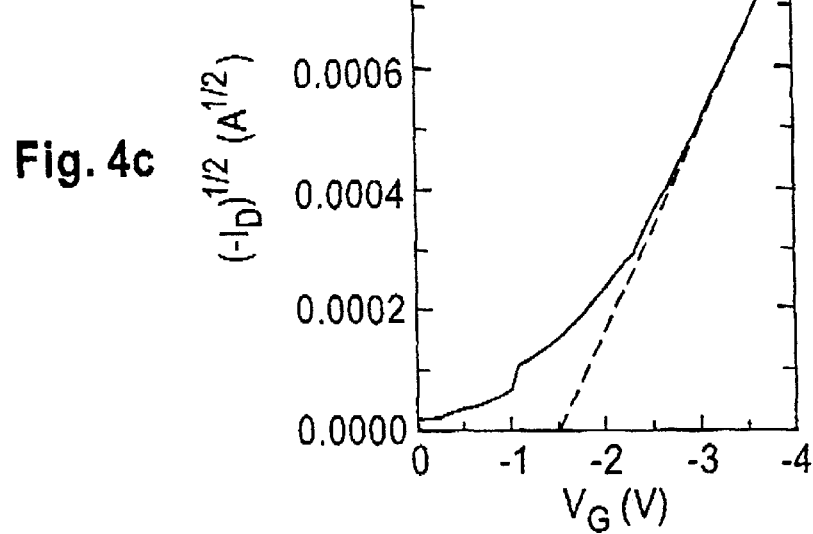
FIG. 4c is a plot of the square root of the drain current from FIG. 4b as a function of the gate voltage in the saturation regime to calculate the field effect mobility.

FIGS. 4a and 4b refer to a pentacene-based TFT, represented by the drawing in FIG. 1, in which capacitance per unit area of the BST gate-insulator layer was similar to the BST film in the previous device. The BST layer was deposited as described in example 4. Both figures show the dependence of $I_D$ on $V_G$ in saturation. FIG. 4c shows a plot of the square root of $I_D$ vs. $V_G$. The field effect mobility, $\mu$, is calculated from the slope of the $\sqrt{|I_D|}$ vs. $V_G$ plot to be 0.62 cm$^2$ V$^{-1}$ sec$^{-1}$. The subthreshold slope, S, is approximately 0.4 volts per decade of current modulation. The channel length was 109 $\mu$m and the channel width, W, was 250 $\mu$m.

We claim that we have demonstrated a structure and a process to fabricate the same to achieve high field effect mobilities, high current modulation and low sub-threshold slope in pentacene based organic TFT's that comprise a chemical solution deposited, relatively high dielectric constant gate insulator. While the present invention has been described with respect to preferred embodiments, numerous modifications, changes, and improvements will occur to those skilled in the art without departing from the spirit and scope of the invention.

What is claimed is:

1. A thin film transistor device structure comprising:
   a substrate upon which a plurality of electrically conducting gate electrodes are disposed;
   a layer of an inorganic gate insulator having a dielectric constant ($\in$) of at least 15 disposed on said electrodes;
   a layer of an organic semiconductor disposed on said insulator and substantially overlapping the said molecules;
   a plurality of sets of electrically conductive source and drain electrodes disposed on said organic semiconductor in alignment with each of said gate electrodes.

2. A method according to claim 1 further including an insulating passivation layer disposed on said structure that protects it from further processing exposures and from the external ambient.

3. A method according to claim 1 wherein the substrate is selected from the group consisting of glass, plastic, quartz, undoped silicon and heavily doped silicon.

4. A method according to claim 3 wherein the said plastic substrate is selected from the group comprising polycarbonate, Mylar, and polyimide.

5. A method according to claim 1 wherein the gate electrode material is selected from the group consisting of chromium, titanium, copper, aluminum, molybdenum, tungsten, nickel, gold, platinum, conducting polyaniline, conducting polypyrrole or combinations thereof.

6. A method according to claim 1 wherein said gate electrodes are 30 nm to 500 nm thick and are produced by a process selected from the group consisting of evaporation, sputtering, chemical vapor deposition, electrodeposition, spin coating, and electroless plating.

7. A method according to claim 1 wherein said high dielectric constant insulator is selected from the group barium strontium titanate, barium zirconate titanate, lead zirconate titanate, lead lanthanum titanate, strontium titanate, barium titanate, barium magnesium fluoride, bismuth titanate, strontium bismuth tantalate and strontium bismuth tantalate niobate.

8. A method according to claim 7 wherein the said insulator has a thickness in the range of 80 nm to 1000 nm.

9. A method according to claim 7 wherein the said gate insulator is fabricated from a precursor comprising a metal alkoxyalkoxide.

10. A method according to claim 7 wherein the said gate insulator is a metal oxide fabricated from a precursor comprising a metal alkoxide.

11. A method according to claim 9 for fabricating the said gate insulator by chemical solution processing comprising: dissolving said precursor in a solvent to form a solution and coating said solution on the substrate followed by a thermal treatment.

12. A method according to claim 10 for fabricating the said gate insulator by chemical solution processing comprising: dissolving the said precursor in a solvent and coating said solution on the substrate followed by a thermal treatment.

13. A method according to claim 9, wherein the metal is selected from the group, Ba, Sr, Ti, Bi, Ta, Zr, Fe, Ni, Mn, Pb, La, Li, Na, K, Rb, Cs, Fr, Be, Mg, Ca, Nb, Tl, Hg, Cu, Co, Rh, Sc, Y.

14. A method according to claim 10, wherein the metal is selected from the group, Ba, Sr, Ti, Bi, Ta, Zr, Fe, Ni, Mn, Pb, La, Li, Na, K, Rb, Cs, Fr, Be, Mg, Ca, Nb, Tl, Hg, Cu, Co, Rh, Sc, Y.

15. A method according to claim 9, wherein the alkoxyalkoxide is derived from an alkoxyalcohol selected from the group consisting of, methoxyethanol, ethoxyethanol, propoxyethanol, butoxyethanol, pentoxyethanol, heptoxyethanol, methoxypropanol, ethoxypropanol, propoxypropanol, butoxypropanol, pentoxypropanol, and heptoxypropanol.

16. A method according to claim 10, wherein the alkoxide is derived from any alcohol including, methanol, ethanol, propanol, isopropanol, butanol, isobutanol, preferably isopropanol.

17. A method to claim 9, wherein said metal alkoxyalkoxide comprises a reaction product of a reaction of a metal with an excess of said alkoxyalcohol with the metal selected from the group Li, Na, K, Rb, Cs, Fr, Be, Mg, Ca, Sr, Ba, Ra.

18. A method according to claim 9, wherein said metal alkoxyalkoxide comprises a reaction product of a metal alkoxide with an excess of an alkoxyalcohol.

19. A method according to claim 15 further including forming a metal alkoxyalkoxide, comprising a reaction of a metal halide with the sodium salt and an alkoxyalcohol with a metal selected from the group consisting of a transition metal and a lanthanide element.

20. A method according to claim 11 wherein said gate insulator is a uniformly doping a metal oxide film formed by adding a small amount of said metal alkoxyalkoxide to said solution before fabrication of said film.

21. A method according to claim 1 wherein said organic semiconductor is any polymeric or oligomeric semiconductor that exhibits an increase in field effect mobility with increasing gate voltage.

22. A method according to claim 21 wherein said organic semiconductor is an acene molecular material selected from the group consisting of one or more of naphtalene, anthracene, tetracene, pentacene, hexacene and derivatives thereof.

23. A method according to claim 22 wherein said acene is pentacene.

24. A method according to claim 21 wherein the said organic semiconductor layer has a thickness in the range from one monolayer to 400 nm.

25. A method according to claim 21 wherein the said semiconductor layer is deposited by a process selected from the group consisting of evaporation, chemical vapor deposition, spin coating and baking, electropolymerization, molecular beam deposition and self assembly from solution or a combination thereof.

26. A method according to claim 21 wherein the said semiconductor layer is optionally segmented by a process selected from the group consisting of deposition through a mask, screen printing, stamping, and patterning of the blanket film, in order to minimize the leakage and stray currents between adjacent TFT devices.

27. A method according to claim 1 wherein said source and drain electrodes are made of a material selected from the group consisting of chromium, titanium, copper, aluminum, molybdenum, tungsten, nickel, gold, palladium, platinum, conducting polymers and combinations thereof.

28. A method according to claim 27 wherein an optional ohmic contact layer made of a material selected from the group consisting of gold, platinum, palladium, conducting polymers and oligomers, semiconducting polymers and oligomers, and combination thereof, is disposed between said source/drain electrodes and said semiconductor layer.

29. A method according to claim 27 wherein the thickness of the said source and drain electrodes is in the range 30 nm to 500 nm.

30. A method according to claim 27 wherein said source and drain electrodes are patterned by a method selected from the group consisting of deposition through shadow mask and lithographic patterning techniques.

31. A method according to claim 2 wherein said passivation layer is a polymer selected from the group consisting of polyimide, parylene and undoped polyaniline.

* * * * *